(12) United States Patent
Wu

(10) Patent No.: US 8,816,497 B2
(45) Date of Patent: Aug. 26, 2014

(54) ELECTRONIC DEVICES AND COMPONENTS FOR HIGH EFFICIENCY POWER CIRCUITS

(75) Inventor: Yifeng Wu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 970 days.

(21) Appl. No.: 12/684,838

(22) Filed: Jan. 8, 2010

(65) Prior Publication Data
US 2011/0169549 A1 Jul. 14, 2011

(51) Int. Cl.
H01L 23/34 (2006.01)

(52) U.S. Cl.
USPC ........... 257/728; 257/499; 257/500; 257/723; 257/724; 257/E27.001; 257/E27.004; 257/E27.012; 257/E25.005; 257/E25.011; 257/E25.029; 438/107; 438/110; 438/133; 438/134

(58) Field of Classification Search
CPC ............ H01L 2924/00; H01L 29/2003; H01L 27/0605; H01L 21/77
USPC .......... 257/499, 500, 723, 724, 728, E27.001, 257/E27.004, E27.009, E27.012, E27.014, 257/E27.061, E27.064, E25.001, E25.005, 257/E25.01, E25.011, E25.012, E25.014, 257/E25.015, E25.016, E25.029; 438/107, 438/110, 133, 134
See application file for complete search history.

(56) References Cited

U.S. PATENT DOCUMENTS

| 4,384,287 | A  | 5/1983  | Sakuma          |
|-----------|----|---------|-----------------|
| 4,728,826 | A  | 3/1988  | Einzinger et al.|
| 4,808,853 | A  | 2/1989  | Taylor          |
| 5,198,964 | A  | 3/1993  | Ito et al.      |
| 5,379,209 | A  | 1/1995  | Goff            |
| 5,493,487 | A  | 2/1996  | Close et al.    |
| 5,637,922 | A  | 6/1997  | Fillion et al.  |
| 5,952,856 | A  | 9/1999  | Horiguchi et al.|
| 6,008,684 | A  | 12/1999 | Ker et al.      |
| 6,107,844 | A  | 8/2000  | Berg et al.     |
| 6,130,831 | A  | 10/2000 | Matsunaga       |
| 6,333,617 | B1 | 12/2001 | Itabashi et al. |
| 6,395,593 | B1 | 5/2002  | Pendharkar et al.|
| 6,521,940 | B1 | 2/2003  | Vu et al.       |

(Continued)

FOREIGN PATENT DOCUMENTS

| CN | 101978589 A | 2/2011 |
| EP | 2 188 842   | 5/2010 |

(Continued)

OTHER PUBLICATIONS

Wu, et al., "A 97.8% Efficient GaN HEMT Boost Converter with 300-W Output Power at 1 MHz", IEEE Electron Device Letters, vol. 29, No. 9, 2008, pp. 824-826.*

(Continued)

Primary Examiner — Meiya Li
(74) Attorney, Agent, or Firm — Fish & Richardson P.C.

(57) ABSTRACT

An electronic component includes a III-N transistor and a III-N rectifying device both encased in a single package. A gate electrode of the III-N transistor is electrically connected to a first lead of the single package or to a conductive structural portion of the single package, a drain electrode of the III-N transistor is electrically connected to a second lead of the single package and to a first electrode of the III-N rectifying device, and a second electrode of the III-N rectifying device is electrically connected to a third lead of the single package.

36 Claims, 11 Drawing Sheets

(56) References Cited

U.S. PATENT DOCUMENTS

| | | | |
|---|---|---|---|
| 6,781,423 B1 | 8/2004 | Knoedgen | |
| 6,900,657 B2 | 5/2005 | Bui et al. | |
| 7,116,567 B2 | 10/2006 | Shelton et al. | |
| 7,304,331 B2 | 12/2007 | Saito et al. | |
| 7,378,883 B1 | 5/2008 | Hsueh | |
| 7,443,648 B2 | 10/2008 | Cutter et al. | |
| 7,477,082 B2 | 1/2009 | Fukazawa | |
| 7,501,669 B2 | 3/2009 | Parikh et al. | |
| 7,548,112 B2 | 6/2009 | Sheppard | |
| 7,639,064 B2 | 12/2009 | Hsiao et al. | |
| 7,719,055 B1 | 5/2010 | McNutt et al. | |
| 7,795,642 B2 | 9/2010 | Suh et al. | |
| 7,804,328 B2 | 9/2010 | Pentakota et al. | |
| 7,851,825 B2 | 12/2010 | Suh et al. | |
| 7,875,907 B2 | 1/2011 | Honea et al. | |
| 7,875,914 B2 | 1/2011 | Sheppard | |
| 7,884,394 B2 | 2/2011 | Wu et al. | |
| 7,898,004 B2 | 3/2011 | Wu et al. | |
| 7,915,643 B2 | 3/2011 | Suh et al. | |
| 7,939,391 B2 | 5/2011 | Suh et al. | |
| 7,965,126 B2 | 6/2011 | Honea et al. | |
| 2002/0125920 A1 | 9/2002 | Stanley | |
| 2003/0178654 A1 | 9/2003 | Thornton | |
| 2004/0169262 A1* | 9/2004 | Oliver et al. | 257/676 |
| 2004/0178831 A1 | 9/2004 | Li et al. | |
| 2005/0067716 A1 | 3/2005 | Mishra et al. | |
| 2005/0077947 A1 | 4/2005 | Munzer et al. | |
| 2005/0146310 A1 | 7/2005 | Orr | |
| 2005/0189561 A1 | 9/2005 | Kinzer et al. | |
| 2005/0189562 A1 | 9/2005 | Kinzer et al. | |
| 2006/0033122 A1 | 2/2006 | Pavier et al. | |
| 2006/0043499 A1 | 3/2006 | De Cremoux et al. | |
| 2006/0060871 A1 | 3/2006 | Beach | |
| 2006/0102929 A1 | 5/2006 | Okamoto et al. | |
| 2006/0176007 A1 | 8/2006 | Best | |
| 2006/0237825 A1 | 10/2006 | Pavier et al. | |
| 2006/0261473 A1* | 11/2006 | Connah et al. | 257/728 |
| 2007/0018210 A1 | 1/2007 | Sheppard | |
| 2007/0080672 A1 | 4/2007 | Yang | |
| 2007/0146045 A1 | 6/2007 | Koyama | |
| 2007/0278518 A1 | 12/2007 | Chen et al. | |
| 2008/0017998 A1 | 1/2008 | Pavio | |
| 2008/0136390 A1 | 6/2008 | Briere | |
| 2008/0158110 A1 | 7/2008 | Iida et al. | |
| 2008/0191342 A1 | 8/2008 | Otremba | |
| 2008/0197458 A1* | 8/2008 | Shi et al. | 257/666 |
| 2008/0203559 A1 | 8/2008 | Lee et al. | |
| 2008/0248634 A1 | 10/2008 | Beach | |
| 2008/0272404 A1 | 11/2008 | Kapoor | |
| 2008/0283844 A1 | 11/2008 | Hoshi et al. | |
| 2009/0072240 A1 | 3/2009 | Suh et al. | |
| 2009/0072269 A1 | 3/2009 | Suh et al. | |
| 2009/0072272 A1 | 3/2009 | Suh et al. | |
| 2009/0146185 A1 | 6/2009 | Suh et al. | |
| 2009/0201072 A1 | 8/2009 | Honea et al. | |
| 2009/0215230 A1 | 8/2009 | Muto et al. | |
| 2009/0236728 A1 | 9/2009 | Satou et al. | |
| 2009/0267078 A1 | 10/2009 | Mishra et al. | |
| 2009/0278513 A1* | 11/2009 | Bahramian et al. | 323/217 |
| 2009/0315594 A1 | 12/2009 | Pentakota et al. | |
| 2010/0067275 A1 | 3/2010 | Wang et al. | |
| 2010/0073067 A1 | 3/2010 | Honea | |
| 2010/0117095 A1* | 5/2010 | Zhang | 257/76 |
| 2011/0019450 A1 | 1/2011 | Callanan et al. | |
| 2011/0025397 A1 | 2/2011 | Wang et al. | |
| 2011/0121314 A1 | 5/2011 | Suh et al. | |
| 2011/0169549 A1 | 7/2011 | Wu | |

FOREIGN PATENT DOCUMENTS

| | | | |
|---|---|---|---|
| EP | 2 243 213 | | 10/2010 |
| JP | 5075040 | A | 3/1993 |
| JP | 6067744 | A | 3/1994 |
| JP | 2000-101356 | A | 4/2000 |
| JP | 2000-124358 | | 4/2000 |
| JP | 2003/244943 | | 8/2003 |
| JP | 2003/338742 | | 11/2003 |
| JP | 2004281454 | A * | 10/2004 |
| JP | 2006/033723 | A | 2/2006 |
| JP | 2006-173754 | A | 6/2006 |
| JP | 2007/036218 | A | 2/2007 |
| JP | 2007/215331 | | 8/2007 |
| JP | 2007-294769 | | 11/2007 |
| JP | 2008/199771 | | 8/2008 |
| JP | 2010/539712 | | 12/2010 |
| JP | 2010/512119 | | 4/2011 |
| TW | 200941920 | | 10/2009 |
| TW | 201027912 | | 7/2010 |
| TW | 201036155 | | 10/2010 |
| WO | WO 2009/036266 | | 3/2009 |
| WO | WO 2009/102732 | | 8/2009 |
| WO | WO 2010/039463 | | 4/2010 |
| WO | WO 2010/090885 | | 8/2010 |
| WO | WO 2011/053981 | | 5/2011 |
| WO | WO 2011/085260 | | 7/2011 |
| WO | WO 2011/097302 | | 8/2011 |

OTHER PUBLICATIONS

Sakiyama, et al., "An On-Chip High-Efficiency and Low-Noise DC/DC Converter Using Drivided Switches with Current Control Technique", 1999 IEEE International Solid-State Circuits Conference, pp. 156-157 and 455, 1999.*

Yifeng Wu et al., "A 97.8% Efficient GaN HEMT Boost Converter With 300-W Output Power at 1 MHz", Aug. 2008, Electronic Device Letters, IEEE, vol. 29, No. 8, pp. 824-826.

Yifeng Wu et al, "Semiconductor Heterostructure Diodes", U.S. Appl. No. 12/332,284, filed Dec. 10, 2008, 51 pages.

Yifeng Wu et al, "III-Nitride Devices and Circuits", U.S. Appl. No. 12/368,248, filed Feb. 9, 2009, 28 pages.

James Honea, "Inductive Load Power Switching Circuits", U.S. Appl. No. 12/556,438, filed Sep. 9, 2009, 35 pages.

U.S. Appl. No. 11/856,695, filed Sep. 17, 2007, Gallium Nitride Diodes and Integrated Components.

U.S. Appl. No. 13/019,150, filed Feb. 1, 2011, Enhancement Mode Gallium Nitride Power Devices.

U.S. Appl. No. 60/971,721, filed Sep. 12, 2007, III-Nitride Bilateral Switches.

U.S. Appl. No. 12/209,581, filed Sep. 12, 2008, III-Nitride Bidirectional Switches.

U.S. Appl. No. 60/972,467, filed Sep. 14, 2007, Growing N-Polar III-Nitride Structures.

U.S. Appl. No. 12/209,504, filed Sep. 12, 2008, Growing N-Polar III-Nitride Structures.

U.S. Appl. No. 60/972,481, filed Sep. 14, 2007, III-Nitride Devices with Recessed Gates.

U.S. Appl. No. 60/012,755, filed Feb. 10, 2007, Insulated Gate E-Mode Transistors.

U.S. Appl. No. 12/324,574, filed Nov. 26, 2008, Insulated Gate E-Mode Transistors.

U.S. Appl. No. 61/028,133, filed Feb. 12, 2008, Bridge Circuits and Their Components.

U.S. Appl. No. 13/164,109, filed Jun. 20, 2011, Bridge Circuits and Their Components.

U.S. Appl. No. 12/108,449, filed Apr. 23, 2008, Enhancement Mode III-N HEMPTs.

U.S. Appl. No. 61/099,451, filed Sep. 23, 2008, Inductive Load Power Switching Circuits.

U.S. Appl. No. 12/556,438, filed Sep. 9, 2009, Inductive Load Power Switching Circuits.

U.S. Appl. No. 13/008,874, filed Jan. 18, 2011, Semiconductor Heterostructure Diodes.

U.S. Appl. No. 12/611,018, filed Nov. 2, 2009, Package Configurations for Low EMI Circuits.

U.S. Appl. No. 12/635,405, filed Dec. 10, 2009, Reverse Side Engineered III-Nitride Devices.

U.S. Appl. No. 12/465,968, filed May 14, 2009, High Voltage III-Nitride Semiconductor Devices.

(56) References Cited

OTHER PUBLICATIONS

U.S. Appl. No. 12/550,140, filed Aug. 28, 2009, Semiconductor Devices with Field Plates.
U.S. Appl. No. 12/684,838, filed Jan. 8, 2010, Electronic Devices and Components for High Efficiency Power Circuits.
U.S. Appl. No. 12/701,458, filed Feb. 5, 2010, Semiconductor Electronic Components and Circuits.
U.S. Appl. No. 12/968,704, filed Dec. 15, 2010, Transistors with Isolated Regions.
U.S. Appl. No. 12/953,769, filed Nov. 24, 2010, Layer Structures for Controlling Stress of Heteroepitaxially Grown III-Nitride.
U.S. Appl. No. 13/019,733, filed Feb. 2, 2011, III-N Device Structures and Methods.
U.S. Appl. No. 13/040,524, filed Mar. 4, 2011, Semiconductor Diodes with Low Reverse Bias Currents.
U.S. Appl. No. 13/040,940, filed Mar. 4, 2011, Electrode Configurations for Semiconductor Devices.
U.S. Appl. No. 61/447,519, filed Feb. 28, 2011, Electronic Components with Reactive Filters.
Authorized officer Kee Yong Park, International Search Report and Written Opinion in PCT/US2011/023485, mailed Sep. 23, 2011, 10 pages.
Authorized officer Keon Hyeong Kim, International Search Report and Written Opinion in PCT/US2008/076160, mailed Mar. 18, 2009, 11 pages.
Authorized officer Jae Woo Wee, International Search Report and Written Opinion in PCT/US2009/033699, mailed Sep. 21, 2009, 11 pages.
Authorized officer Dorothée Mülhausen, International Preliminary Report on Patentability in PCT/US2009/033699, mailed Aug. 26, 2010, 6 pages.
Authorized officer Sung Hee Kim, International Search Report and Written Opinion in PCT/US2009/057554, mailed May 10, 2010, 13 pages.
Authorized officer Gijsbertus Beijer, International Preliminary Report on Patentability in PCT/US2009/057554, mailed Apr. 7, 2011, 7 pages.
Authorized officer Sung Chan Chung, International Search Report and Written Opinion in PCT/US2010/021824, mailed Aug. 23, 2010, 9 pages.
Authorized officerBon Gyoung Goo, International Search Report and Written Opinion in PCT/US2010/055129, mailed Jul. 1, 2011, 11 pages.
Authorized officer Simin Baharlou, International Preliminary Report on Patentability in PCT/US2008/076160, mailed Mar. 25, 2010, 6 pages.
Authorized officer Beate Giffo-Schmitt, International Preliminary Report on Patentability in PCT/US2010/021824, mailed Aug. 23, 2010, 6 pages.
Authorized officer Sung Joon Lee, International Search Report and Written Opinion in PCT/US2011/020592, mailed Sep. 19, 2011, 9 pages.
Chen, et al., "Single-Chip Boost Converter Using Monolithically Integrated AlGaN/GaN Lateral Field-Effect Rectifier and Normally Off HEMT," IEEE Electron Device Letters, May 2009, 30(5):430-432.
Authorized officer Philippe Bécamel, International Preliminary Report on Patentability in PCT/US2011/020592, mailed Jul. 19, 2012, 7 pages.

* cited by examiner

ELECTRONIC DEVICES AND COMPONENTS FOR HIGH EFFICIENCY POWER CIRCUITS

TECHNICAL FIELD

Power switching circuits and components which can be used in power switching circuit applications to realize power circuits with very high efficiencies are described.

BACKGROUND

As the amount of worldwide electrical power consumption has been constantly increasing, power supplies and power converters have become increasingly important in our society. A circuit schematic of the primary elements of a boost-mode DC-to-DC power converter (herein a "boost converter") is shown in FIG. 1. The boost converter circuit includes inductors 10 and 14, a switching device, i.e., a transistor 11, a rectifying device, i.e., a diode 12, and charge storage devices, i.e., capacitors 13 and 15. During the time that the transistor 11 is ON, the inductor 10 sustains the entire input voltage, and the input current flows through the inductor 10 and the transistor 11, while the electric energy is stored as magnetic energy in the inductor 10. At the same time, the diode 12 prevents the capacitor 13 from discharging through the transistor 11. When the transistor 11 is OFF, the potential across the inductor 10 is reversed and the input current flowing through the inductor 10 also flows through the diode 12, thereby charging the capacitor 13 and supplying energy to the output load at a higher voltage potential than that at the input line.

To date, the diodes and transistors used in power circuits such as the boost converter circuit of FIG. 1 have typically been fabricated with silicon (Si) semiconductor materials. Common diode and transistor devices for power applications include Silicon (Si) Schottky diodes, Si Power MOSFETs such as CoolMOS, and Si Insulated Gate Bipolar Transistors (IGBTs). While Si power devices are inexpensive, they suffer from a number of disadvantages, including relatively low switching speeds and high levels of electrical noise, commonly referred to as electro-magnetic interference or EMI. There has been a consistent trend to increase switching frequencies for more compact power supplies, which requires that the devices used in the power supply have higher switching speeds and that circuit architecture be improved to adequately suppress increased electrical noise resulting from higher frequency of operation. Recently, silicon carbide (SiC) power devices have been researched due to their superior electrical and thermal properties as compared to Si devices. III-Nitride (III-N) based semiconductor devices are now also emerging as attractive candidates for power circuit applications.

While the use of III-N devices has shown to be beneficial in power applications, further improvements may be necessary to adequately suppress EMI while simultaneously maintaining a high efficiency as circuit switching frequencies and switching speeds are further increased.

SUMMARY

In one aspect, an electronic component having a III-N transistor and a III-N rectifying device is described. A single package encloses both the III-N transistor and the III-N rectifying device. A gate electrode of the III-N transistor is electrically connected to a first lead of the single package or to a conductive structural portion of the single package, a drain electrode of the III-N transistor is electrically connected to a second lead of the single package and to a first electrode of the III-N rectifying device, and a second electrode of the III-N rectifying device is electrically connected to a third lead of the single package.

In another aspect, a voltage converter having an efficiency greater than 97.8% and a peak output voltage noise less than 1 Volt when operated at a frequency of at least 100 kHz and a conversion ratio of 1:2 is described.

In yet another aspect, a method for operating a switching transistor in a power switching circuit is described. The method includes switching a voltage on a gate of the switching transistor, relative to a source of the switching transistor, from a value above a transistor threshold voltage to a value below the transistor threshold voltage, or from a value below a transistor threshold voltage to a value above the transistor threshold voltage. The voltage is switched at a rate of about 150 volts/nanosecond or higher.

In implementations, the following features are included or enabled. The III-N transistor can be a field-effect transistor. The III-N transistor can be a high voltage switching transistor. The III-N transistor can be an enhancement-mode device. The III-N rectifying device can be a III-N diode, the first electrode can be an anode electrode, and the second electrode can be a cathode electrode. The III-N transistor or the III-N diode can be a lateral device comprising an insulating or semi-insulating portion, and the insulating or semi-insulating portion can be mounted directly to the conductive structural portion of the single package, without an insulating spacer between the III-N transistor and the conductive structural portion of the single package or between the III-N diode and the conductive structural portion of the single package. The insulating or semi-insulating portion can be an insulating or semi-insulating substrate. The III-N transistor or the III-N diode can be a lateral device comprising a conducting or semi-conducting substrate, and an insulating or semi-insulating III-N layer can be between the conducting or semi-conducting substrate and a channel of the III-N transistor or the III-N diode, where the conducting or semi-conducting substrate can be mounted directly to the conductive structural portion of the single package, without an insulating spacer between the III-N transistor and the conductive structural portion of the single package or between the III-N diode and the conductive structural portion of the single package. The conducting or semi-conducting substrate can be a silicon substrate. The III-N transistor and the III-N diode can be on a common substrate. The III-N transistor can be a first III-N transistor and the III-N rectifying device can be a second III-N transistor. The first III-N transistor or the second III-N transistor can be a lateral device comprising an insulating or semi-insulating portion, and the insulating or semi-insulating portion can be mounted directly to the conductive structural portion of the single package without an insulating spacer between the first III-N transistor and the conductive structural portion of the single package or between the second III-N transistor and the conductive structural portion of the single package. The insulating or semi-insulating portion can be an insulating or semi-insulating substrate. The first III-N transistor or the second III-N transistor can be a lateral device comprising a conducting or semi-conducting substrate, and an insulating or semi-insulating III-N layer between the conducting or semi-conducting substrate and a channel of the first III-N transistor or the second III-N transistor, wherein the conducting or semi-conducting substrate can be mounted directly to the conductive structural portion of the single package, without an insulating spacer between the III-N transistor and the conductive structural portion of the single package or between the III-N diode and the conductive structural portion of the single package. The first III-N transistor and the second III-N transistor can be formed on a common substrate. A source electrode of the III-N transistor can be electrically connected to a conductive structural portion of the single package or to a source lead of the single package. The III-N transistor can be a III-N depletion-mode transistor, and the electronic component can further comprise an enhancement-mode transistor encased in the single package, the enhancement-mode transistor comprising an e-mode transistor source electrode, an e-mode transistor gate electrode, and an e-mode transistor drain electrode, wherein the e-mode transistor source electrode can be electrically connected to the conductive structural portion of the single package or to a source lead of the single package, the e-mode transistor drain electrode can be electrically connected to a source electrode of the III-N depletion-mode transistor, and the e-mode transistor gate electrode can be electrically connected to the first lead of the single package. The III-N depletion-mode transistor can be a high-voltage switching transistor, and the enhancement-mode transistor can be a low-voltage transistor. The enhancement-mode transistor can be a Si MOS device. A voltage converter can comprise one of the electronic components described herein. A voltage converter can have an efficiency is greater than 97.8% and the peak output voltage noise is less than 1 Volt when the voltage converter is operated at a frequency of at least 1 MHz. The voltage converter can include device which is capable of operating as a normally-off switch. The device of the voltage converter can be an enhancement-mode III-N transistor. The device of the voltage converter can be an assembly comprising a low-voltage enhancement-mode transistor and a high-voltage depletion-mode transistor. The low-voltage enhancement-mode transistor can be a Si MOS transistor and the high-voltage depletion-mode transistor can be a III-N transistor. A peak output voltage noise of the power switching circuit can be less than 1V.

DESCRIPTION OF DRAWINGS

Like reference symbols in the various drawings indicate like elements.

DETAILED DESCRIPTION

Figure 1:
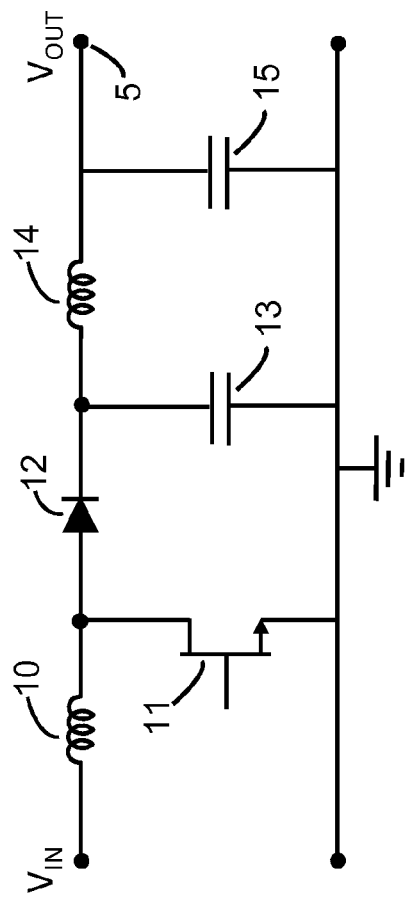
FIG. 1 is a circuit schematic of a voltage converter circuit of the prior art.
Figure 2:
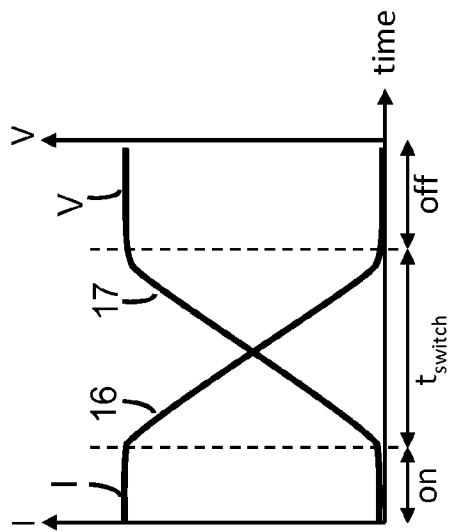
FIG. 2 is a representative plot of transistor source-drain current versus time and source-drain voltage versus time for a transistor in the circuit of FIG. 1.

In high power switching circuits, for example the boost converter of FIG. 1, switching losses are incurred each time transistor 11 is switched from OFF to ON or from ON to OFF. Switching losses include both RC charging losses and cross-over losses. As seen in the representative plots of transistor source-drain current versus time and source-drain voltage versus time shown in FIG. 2, during the time $t_{switch}$ that the transistor is switched from ON to OFF, the voltage 17 across the transistor increases while the current 16 through the transistor decreases (conversely, the voltage across the transistor decreases while the current through the transistor increases during the time that the transistor is switched from OFF to ON). The instantaneous cross-over power loss during switching is given by the product of the current through the transistor and the voltage across the transistor, and the total energy lost during switching is given by the time integral of the power loss over the entire switching time. Reducing the transistor switching time $t_{switch}$ (i.e., increasing the switching speed) reduces the total cross-over energy loss during switching and can thereby reduce power loss and increase the efficiency of the circuit. Hence, it can be beneficial to switch the transistor at higher switching speeds during circuit operation, since this can increase the efficiency of the circuit.

The maximum speed a switching transistor can be switched during circuit operation is largely limited by physical properties of the transistor, such as the channel charge density, channel charge mobility, and channel charge saturation velocity, as well as any intrinsic or parasitic capacitances or resistances in the transistor. Operation of the transistor at a switching speed that exceeds the maximum that the transistor is designed or rated for can result in reliability problems and/or electro-magnetic interference (EMI). Switching transistors currently used in conventional power switching circuits such as boost converter circuits, for example Si-based CoolMOS transistors, are typically rated to be operated at a maximum switching speed of 50 Volts/nanosecond. III-Nitride (i.e., III-N) transistors, such as III-N HEMTs or HFETs, typically have superior intrinsic electronic properties and lower capacitances as compared to Si-based transistors designed to operate at similar voltages and currents, and may therefore be capable of operating at higher switching speeds, such as about 150 Volts/nanosecond or higher, about 200 Volts/nanosecond or higher, or about 250 Volts/nanosecond or higher. As used herein, the terms III-Nitride or III-N materials, layers, devices, etc., refer to a material or device comprised of a compound semiconductor material according to the stoichiometric formula $Al_xIn_yGa_zN$, where x+y+z is about 1.

Figure 3:
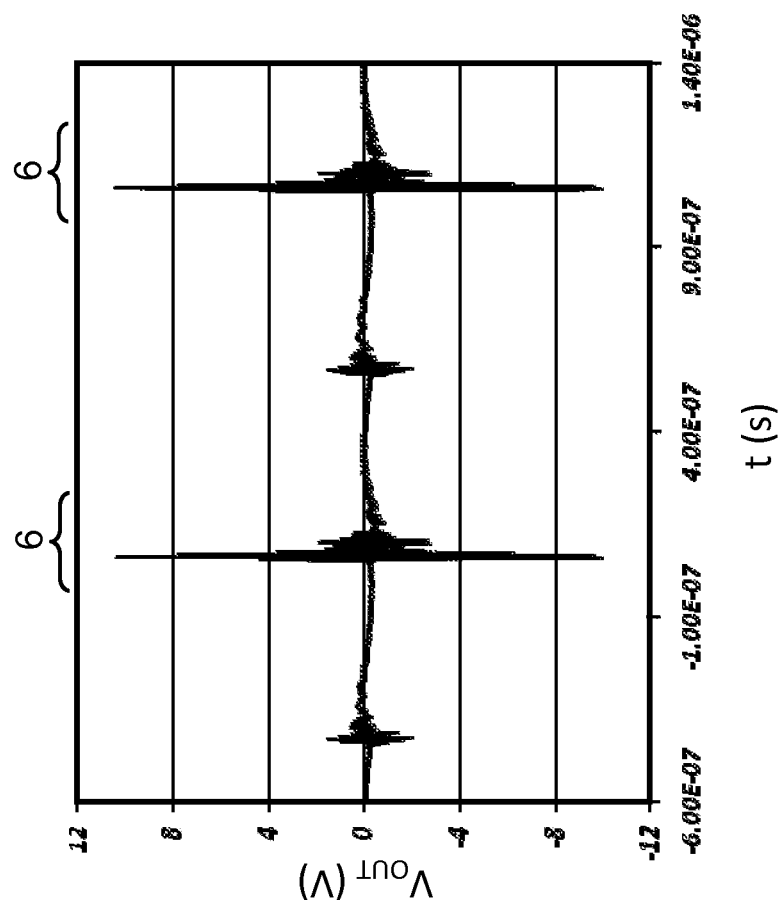
FIG. 3 is a plot of transient voltage noise versus time at the output node of the voltage converter circuit of FIG. 1.

FIG. 3 shows a plot of output voltage noise versus time as measured by the applicant at the output node 5 of the boost converter circuit of FIG. 1 during circuit operation, where a III-N HEMT was used for transistor 11 and a III-N diode was used for diode 12, and the transistor 11 was switched at a switching speed of 200 Volts/nanosecond. As shown, a substantial amount of voltage fluctuation, i.e., "ringing" 6, which is an indication of EMI, was observed at node 5 immediately after each time the III-N HEMT transistor was switched. As seen in FIG. 3, the peak output voltage noise was greater than 10 V. Hence, further improvements were necessary to suppress EMI for operation at higher switching speeds.

While the III-N HEMT and III-N diode that applicant inserted into the boost converter circuit of FIG. 1 are themselves inherently capable of operating at higher circuit switching speeds without generating substantial EMI, other circuit parasitics can still generate EMI or contribute to EMI generation within the circuit. Therefore, layout configurations which reduce or eliminate these parasitics may be necessary in order for the circuit to operate at higher switching speeds without generating substantial EMI.

Figure 4:
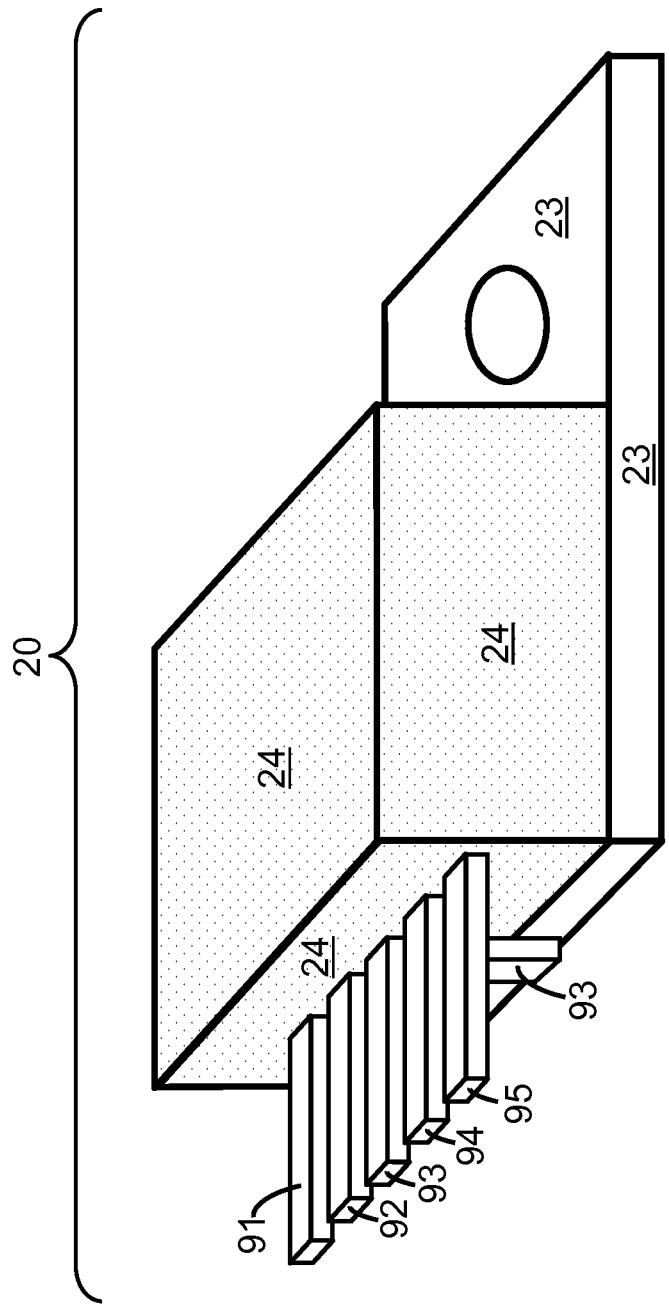
FIGS. 4 and 5 are perspective and exposed plan views, respectively, of an electronic component.
Figure 5:
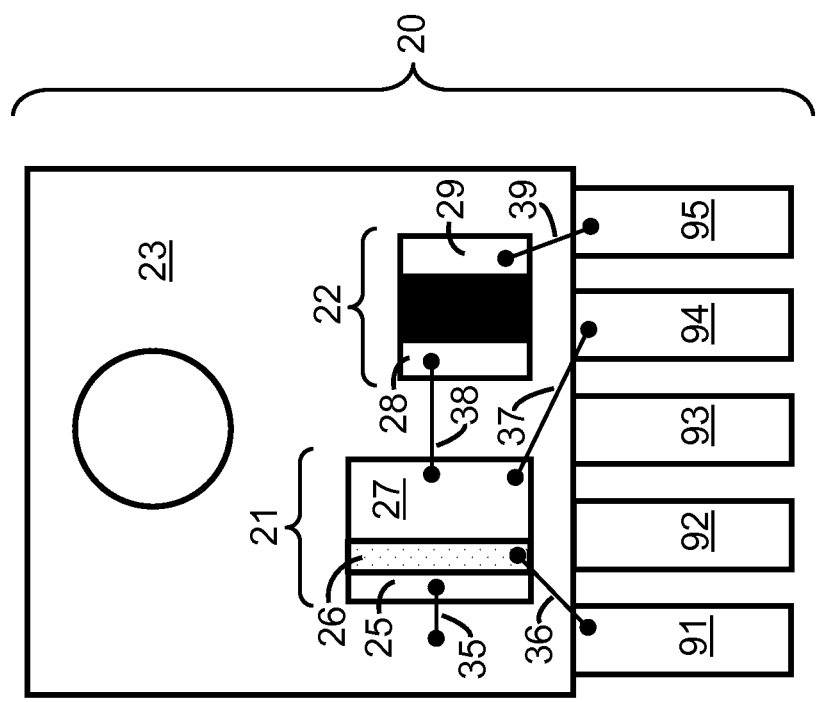

FIGS. 4 and 5 show a perspective view and an exposed plan view, respectively, of a single electronic component 20 that can be used in place of both the transistor 11 and the diode 12 in the boost converter circuit of FIG. 1. Using electronic component 20 in place of the transistor 11 and the diode 12 in a boost converter circuit, where transistor 11 and diode 12 are each individually packaged, can result in reduced or negligible EMI produced by the circuit even when the transistor switching speed is increased during operation. The perspective view of FIG. 4 shows only the package of the electronic component, while the plan view of FIG. 5 illustrates portions of the package along with the electronic devices which are encased or encapsulated within the package. The electronic component 20 includes a III-N transistor 21 and a III-N rectifying device 22 both encased, enclosed, or encapsulated in a single package.

The single package includes encapsulating structural portions, such as a case 24 and a package base 23, as well as non-structural portions, such as leads 91-95. As used herein, "structural portions" of a package are portions which form the basic shape or molding of the package and provide the structural rigidity of the package necessary to protect the enclosed devices. In many cases, when an electronic component which includes a package is used in a discrete circuit, a structural portion of the package is directly mounted to the circuit or circuit board. In the single package of FIG. 4, the package base 23 is formed of an electrically conducting material, i.e., the package base 23 is an electrically conductive structural portion of the package, and the case 24 is formed of an insulating material. The single package includes at least three leads, a gate lead 91, a drain lead 94, and a cathode lead 95, and can optionally include at least two additional leads, such as open lead 92 and source lead 93. The leads 91-95 are each formed of an electrically conducting material. The source lead 93, when included, can be either electrically connected to or electrically isolated from the package base 23, and all other leads are electrically isolated from the package base. As used herein, two or more contacts or other items are said to be "electrically connected" if they are connected by a material which is sufficiently conducting to ensure that the electric potential at each of the contacts or other items is intended to be the same, i.e., is about the same, at all times under any bias conditions.

As used herein, a "single package" is a package containing, enclosing, encapsulating, or encasing one or more electronic devices or components (i.e., the III-N transistor 21 and the III-N rectifying device 22), which are not each individually encased or encapsulated in a package separate from one another. That is, a single package can have a perimeter within which the one or more electronic devices are located and there is no packaging separating or in the space between one of the electronic devices and another of the electronic devices within the single package. A single package includes structural portions, such as the package base 23 and case 24 in FIG. 4, which can form a single cavity in which the electronic devices or components are enclosed. Or, the electronic devices or components contained in the package can be supported by the package base, and a single case 24 can be molded around the enclosed electronic devices or components, such that the single package does not contain any cavity or cavities (i.e., the single package is free of any cavity or cavities), and the case material contacts the enclosed electronic devices or components. The footprint of the case 24, i.e., the area of the case as measured parallel to a main surface of the package base 23 may be less than 900 square millimeters, less than 400 square millimeters, or less than 100 square millimeters. The enclosed electronic devices or components are supported by the package base 23. There may be no package base material or case material between any of the electronic devices, i.e., if there is a cavity formed by the case 24 the cavity may be a continuous cavity. The connections between the various electronic devices or components enclosed in the single package can be wire bonds or can be formed by wire bonding. Connections between various enclosed electronic devices or components to one another, or to portions of the package, are not formed by circuit traces on a circuit board. That is, the interior of the cavity in the single package can be free of circuit traces, i.e., conductive trace lines that are deposited on a circuit board. A single package has mechanical integrity without inclusion of any additional casing.

Figure 6:
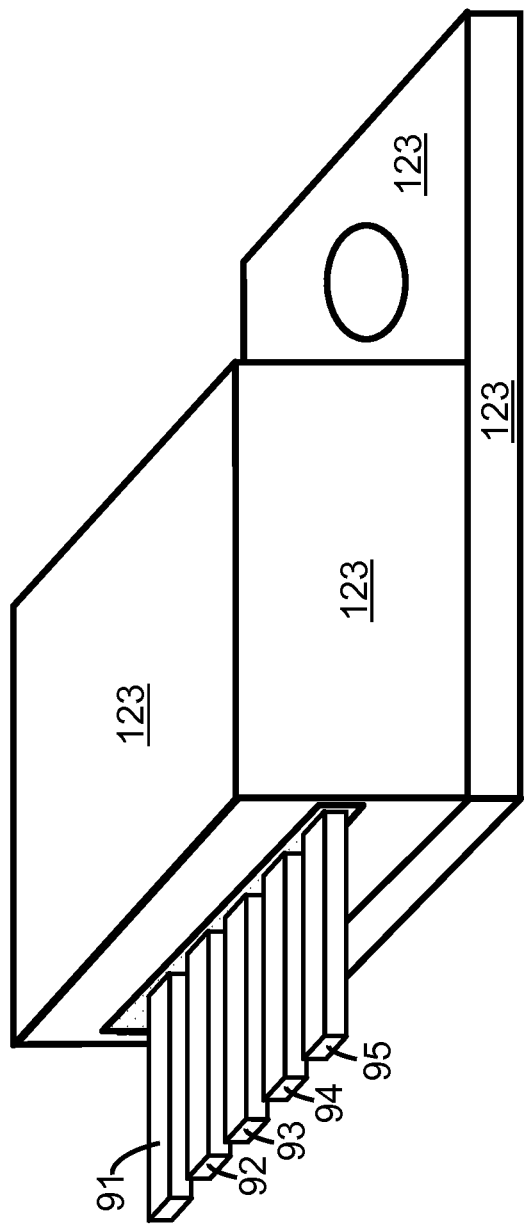
FIG. 6 is a perspective view of an electronic component.

As shown in FIG. 6, in some implementations, the package base 23 and case 24 are replaced by a conducting case 123, i.e., an electrically conductive structural portion, which completely surrounds the enclosed transistor, in which case the source lead 93, when included, is either electrically connected to or electrically isolated from the conducting case, and all other leads are electrically isolated from the conducting case.

The III-N transistor 21 can be a field-effect transistor (FET), such as a high-electron mobility transistor (HEMT), a heterojunction field-effect transistor (HFET), a POLFET, a JFET, a MESFET, a CAVET, or any other III-N transistor structure suitable for power switching applications. Examples of III-N transistors that may be suitable for power switching applications can be found in U.S. Publication number 2009-0072272, published Mar. 19, 2009, U.S. Publication number 2009-0072240, published Mar. 19, 2009, U.S. Publication number 2009-0146185, published Jun. 11, 2009, U.S. patent application Ser. No. 12/108,449, filed Apr. 23, 2008, U.S. patent application Ser. No. 12/332,284, filed Dec. 10, 2008, U.S. patent application Ser. No. 12/368,248, filed Feb. 9, 2009, and U.S. Publication number 2009-0072269, published Mar. 19, 2009, all of which are hereby incorporated by reference.

In some implementations, the III-N transistor 21 is an enhancement-mode (E-mode) device, i.e., a normally off device, such that the threshold voltage is greater than 0V, such as about 1.5V-2V or greater than 2V. In other implementations, the III-N transistor is a depletion-mode (D-mode) device, i.e., a normally on device, such that the threshold voltage is less than 0V. Enhancement-mode devices can be preferable in power switching applications in order to prevent accidental turn on of the devices in case of device or circuit failure. In some implementations, the III-N transistor 21 is a high voltage switching transistor. As used herein, a high voltage switching transistor is a transistor optimized for high voltage switching applications. That is, when the transistor is off, it is capable of blocking high voltages, such as about 300V or higher, about 600V or higher, or about 1200V or higher, and when the transistor is on, it has a sufficiently low on-resistance ($R_{ON}$) for the application in which it is used, i.e., it experiences sufficiently low conduction loss when a substantial current passes through the device.

Figure 7:
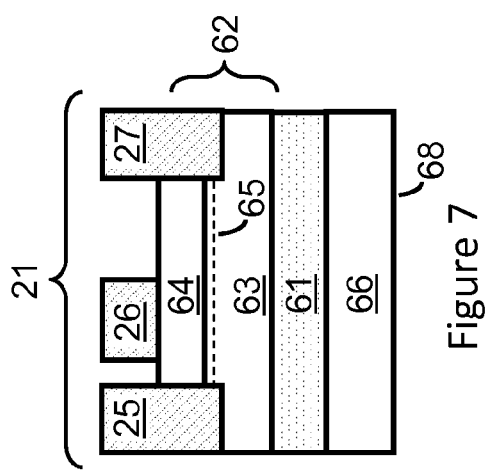
FIG. 7 is a schematic cross-sectional view of a III-N HEMT device.

The III-N transistor 21 can be a lateral device with an insulating or semi-insulating portion on an opposite side of the semiconductor body from all of the electrodes, such as the III-N HEMT illustrated in FIG. 7. In some implementations, a semi-insulating layer is formed by doping a semiconductor layer to render the layer electrically insulating, although not as insulating as some insulating materials. The III-N HEMT of FIG. 7 includes an insulating or semi-insulating portion 61, a semiconductor body 62 which includes a III-N buffer layer 63, such as a layer of GaN, and a III-N barrier layer 64, such as a layer of AlGaN, a two-dimensional electron gas (2DEG) channel 65, a source electrode 25, a gate electrode 26, and a drain electrode 27. The III-N HEMT can optionally include a conducting or semi-conducting portion 66, such as a silicon substrate.

In some implementations, conducting or semi-conducting portion 66 is not included, and the insulating or semi-insulating portion 61 is an insulating or semi-insulating substrate or carrier wafer. In other implementations, conducting or semi-conducting portion 66 is included and is a silicon substrate or an electrically conducting carrier wafer, and the insulating or semi-insulating portion 61 is an insulating or semi-insulating III-N layer. As used herein, a "substrate" is a material layer on top of which semiconductor material layers of a semiconductor device are epitaxially grown such that the crystalline structure of the portion of semiconductor material contacting or adjacent to the substrate at least partially conforms to or is at least partially determined by the crystalline structure of the substrate. In some implementations, the substrate does not contribute to any conduction of current through the semiconductor device. Having the III-N transistor 21 be a lateral device with an insulating or semi-insulating portion on an opposite side of the semiconductor body 62 from all of the electrodes can be advantageous, since when mounting the III-N transistor 21 inside the package, the surface of the device on a side opposite the electrodes, i.e., surface 68, can be mounted directly to the package base 23 without requiring an insulating spacer, such as a "shim", between the III-N transistor 21 and the package base 23. For example, when conducting or semi-conducting portion 66 is not included, the insulating or semi-insulating portion 61 can be mounted directly to the package base 23 without requiring an insulating spacer between the III-N transistor 21 and the package base 23, and when conducting or semi-conducting portion 66 is included, the conducting or semi-conducting portion 66 can be mounted directly to the package base 23 without requiring an insulating spacer between the III-N transistor 21 and the package base 23. Transistors which are currently used in conventional power switching circuits, for example Si CoolMOS transistors, are typically vertical devices with electrodes on both sides of the semiconductor body, and therefore require an insulating spacer between the transistor and the package base, which can result in poorer dissipation of heat generated during operation of the transistor and in some cases can result in more EMI produced during circuit operation.

The III-N transistor 21 may also include additional features for power switching applications. These can include, but are not limited to, insulating layers between the gate and the semiconductor body, surface passivation layers, field plates, recesses in the semiconductor body beneath the gate, and additional semiconductor layers, such as an AlN layer between the III-N buffer layer 63 and the III-N barrier layer 64, or a III-N back-barrier layer between the 2DEG 65 and the insulating or semi-insulating portion 61 or between the 2DEG 65 and the conducting or semi-conducting portion 66.

The III-N rectifying device 22 can be a III-N diode. Examples of III-N diodes that may be used can be found in U.S. patent application Ser. No. 12/332,284, filed Dec. 10, 2008, and in U.S. Publication number 2009-0072269, published Mar. 19, 2009, both of which are hereby incorporated by reference throughout. The III-N rectifying device 22 can be a lateral III-N diode with an insulating or semi-insulating portion on an opposite side of the semiconductor body from all of the electrodes, such as the III-N diode illustrated in FIG. 8. The III-N diode of FIG. 8 includes an insulating or semi-insulating portion 61, a semiconductor body 62 which includes a III-N buffer layer 63, such as GaN, and a III-N barrier layer 64, such as AlGaN, a two-dimensional electron gas (2DEG) channel 65, an anode contact 28 contacting the semiconductor body 62 on a side opposite the insulating or semi-insulating portion 61 and forming a Schottky contact with the semiconductor materials of the semiconductor body 62, and a cathode contact 29 which forms an ohmic contact with the 2DEG channel 65. The III-N diode can optionally include a conducting or semi-conducting portion 66, such as a silicon substrate.

In some implementations, the conducting or semi-conducting portion 66 is not included, and the insulating or semi-insulating portion 61 is an insulating or semi-insulating substrate or carrier wafer. In other implementations, conducting or semi-conducting portion 66 is included and is a silicon substrate or an electrically conducting carrier wafer, and the insulating or semi-insulating portion is an insulating or semi-insulating III-N layer. Having the III-N rectifying device 22 be a lateral diode with an insulating or semi-insulating portion on an opposite side of the semiconductor body 62 from all of the electrodes can be advantageous. When mounting the III-N diode inside the package, the surface of the device on a side opposite the electrodes, i.e., surface 69, can be mounted directly to the package base 23 without requiring an insulating spacer, such as a "shim", between the III-N diode 22 and the package base 23. For example, when conducting or semi-conducting portion 66 is not included, the insulating or semi-insulating portion 61 can be mounted directly to the package base 23 without requiring an insulating spacer between the III-N diode 22 and the package base 23, and when conducting or semi-conducting portion 66 is included, the conducting or semi-conducting portion 66 can be mounted directly to the package base 23 without requiring an insulating spacer between the III-N diode 22 and the package base 23. Diodes which are currently used in conventional power switching circuits, for example SiC diodes, are typically vertical devices with electrodes on both sides of the semiconductor body, and therefore require an insulating spacer between the diode and the package base, which can result in poorer dissipation of heat generated during operation of the diode and in some cases can result in more EMI produced during circuit operation.

III-N diodes used as a III-N rectifying device 22 may also include additional features for power switching applications. These can include, but are not limited to, surface passivation layers, field plates, recesses in the semiconductor body beneath the anode, and additional semiconductor layers, such as an AlN layer between the III-N buffer layer 63 and the III-N barrier layer 64, or a III-N back-barrier layer between the 2DEG 65 and the insulating or semi-insulating portion 61.

Figure 8:
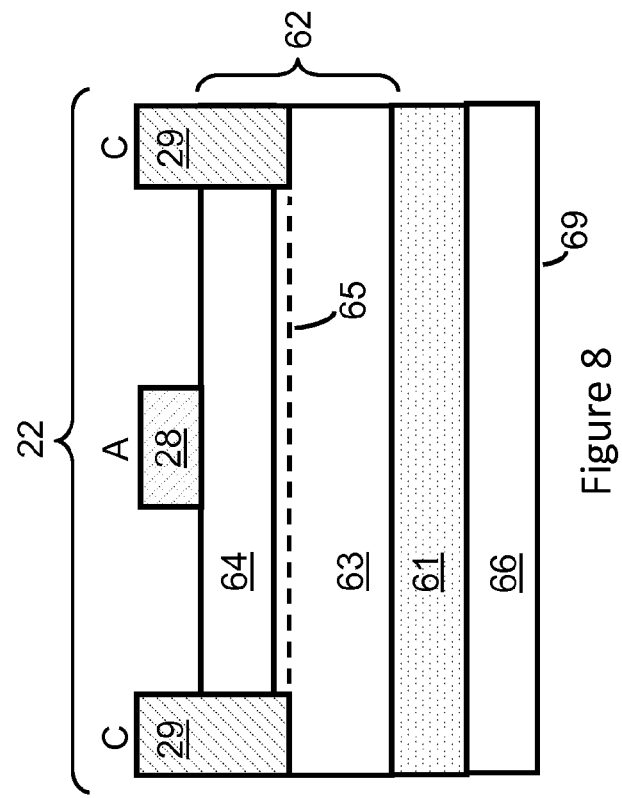
FIG. 8 is a schematic cross-sectional view of a III-N diode.

In some implementations, the III-N transistor 21 is formed of or includes the same III-N material layer structure as the III-N rectifying device 22 (see FIGS. 7 and 8). In some implementations, the III-N transistor 21 and the III-N rectifying device 22 share or are formed on a common substrate. Forming the devices on a common substrate can be advantageous, since both devices can be integrated onto a single die, and electrical contacts between electrodes can be lithographically defined rather than being formed of wire bonds, thereby simplifying the circuit and reducing production costs. Examples of III-N transistors and diodes that can be formed of or include the same III-N material layer structure, and/or can share a common substrate, can be found in U.S. patent application Ser. No. 12/332,284, filed Dec. 10, 2008.

Figure 9:
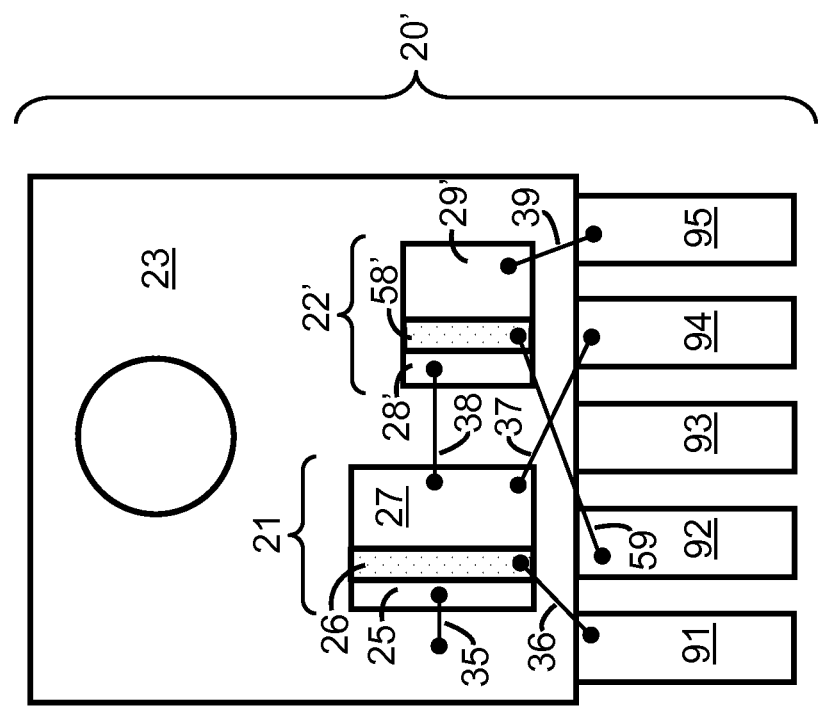
FIGS. 9 and 10 are exposed plan views of electronic components.

In some implementations, the III-N rectifying device is a second III-N transistor, as shown in FIG. 9. The III-N rectifying device is hereby referred to as III-N rectifying device 22' or second III-N transistor 22' when it is formed of a second III-N transistor. For example, the III-N rectifying device 22' can be formed of a III-N transistor which is similar to or the same in structure as the III-N transistor 21. The III-N transistor 22' can be a high voltage switching transistor. A description of methods in which a III-N transistor can be used as a rectifying device in circuits such as boost converters can be found in U.S. patent application Ser. No. 12/556,438, filed Sep. 9, 2009, which is hereby incorporated by reference throughout.

When a III-N diode is used for III-N rectifying device 22, the III-N transistor 21 and the III-N diode are mounted inside the single package and connected as follows. Referring back to FIG. 5, electrical connectors 35-39, which can be single or multiple wire bonds, are used to electrically connect portions of the package, III-N transistor, and III-N diode to one another. The III-N transistor 21 and the III-N diode 22 are both mounted inside the package with their respective insulating or semi-insulating substrates in contact with the package base 23. The source electrode 25 of the III-N transistor 21 is electrically connected to a conductive structural portion of the package, such as the package base 23, or can alternatively be electrically connected to source lead 93 of the package, such as by conductive connector 35. The gate electrode 26 of the III-N transistor 21 is electrically connected to the gate lead 91 of the package, such as by conductive connector 36. The drain electrode 27 of the III-N transistor 21 is electrically connected to the anode contact 28 of the III-N diode, such as by conductive connector 38. The drain electrode 27 and anode contact 28 are both electrically connected to drain lead 94 of the package, such as by wire bonding one or both of these contacts/electrodes to the drain lead 94, as shown by conductive connector 37. The cathode contact 29 of the III-N diode is electrically connected to cathode lead 95 of the package, such as by conductive connector 39.

When a second III-N transistor is used for III-N rectifying device 22', the first III-N transistor 21 and the second III-N transistor 22' are mounted inside the single package and connected as follows. Referring to FIG. 9, the III-N transistor 21 and the second III-N transistor 22' are both mounted inside the package with their respective insulating or semi-insulating substrates in contact with the package base 23. The source electrode 25 of the III-N transistor 21 is electrically connected to a conductive structural portion of the package, such as the package base 23, or can alternatively be electrically connected to source lead 93 of the package, such as by conductive connector 35. The gate electrode 26 of the III-N transistor 21 is electrically connected to the gate lead 91 of the package, such as by conductive connector 91. The drain electrode 27 of the III-N transistor 21 is electrically connected to the source electrode 28' of the second III-N transistor 22', such as by conductive connector 38. Both of drain electrode 27 of the first transistor and the source electrode 28' of the second transistor are electrically connected to drain lead 94 of the package, such as by wire bonding one or both of these electrodes to the drain lead, e.g., by conductive connector 37. The drain electrode 29' of the second III-N transistor 22' is electrically connected to cathode lead 95 of the package, such as by conductive connector 39. The gate electrode 58' of the second III-N transistor 22' can be electrically connected to lead 92 of the package, such as by conductive connector 59.

When the electronic component of FIG. 6 is used in a boost converter circuit or in many other circuits, the source electrode 25 of the III-N transistor 21 is electrically connected to a DC ground, an AC ground, or a circuit ground. As used herein, a node, device, layer, or component is said to be "AC grounded" if it is held at a fixed DC potential at all times during operation. AC and DC grounds are collectively referred to as "circuit grounds". When the source electrode 25 is electrically connected to the package base 23, the source electrode 25 can be DC or AC grounded by mounting the package base 23 to a ground plane of the circuit. In this case, package leads 92 and 93 can be omitted, resulting in a package with only 3 leads, with one lead, e.g., gate lead 91, connected to the transistor gate electrode 26, one lead, e.g., drain lead 94, connected to the transistor drain electrode 27, and one lead, e.g., cathode lead 95, connected to the diode cathode contact 29. Forming a device with only three leads can be advantageous in that there are many standard commercially available packages that are only available with 3 leads. When the package includes source lead 93, and the source electrode 25 is electrically connected to source lead 93, the source electrode 25 can be DC or AC grounded either by connecting source lead 93 to a circuit ground, or else having source lead 93 electrically connected to the package base 23 and connecting the package base to a circuit ground. Regardless of the number of leads on the package, the leads may be ordered from one side of the package to the other in any order desired, the order not limited to that of the example shown in FIG. 6. Ideally, the leads are ordered such that the total length of all electrical connectors and/or the total footprint of the transistor, diode, and package lead network is minimized, thereby reducing parasitics and potentially reducing EMI produced during circuit operation.

Although it is desirable to have III-N transistor 21 in FIGS. 6 and 9 be an enhancement-mode device, in practice it can be difficult to fabricate III-N transistors with threshold voltages sufficiently greater than 0V that also have desirable characteristics for use in high power switching applications. This problem can be resolved by replacing the III-N transistor 21 in FIG. 6 with a high-voltage III-N depletion-mode (D-mode) transistor 21', herein III-N D-mode transistor 21', and a low-voltage enhancement-mode transistor 41, herein E-mode transistor 41, connected as shown in FIG. 10.

Figure 10:
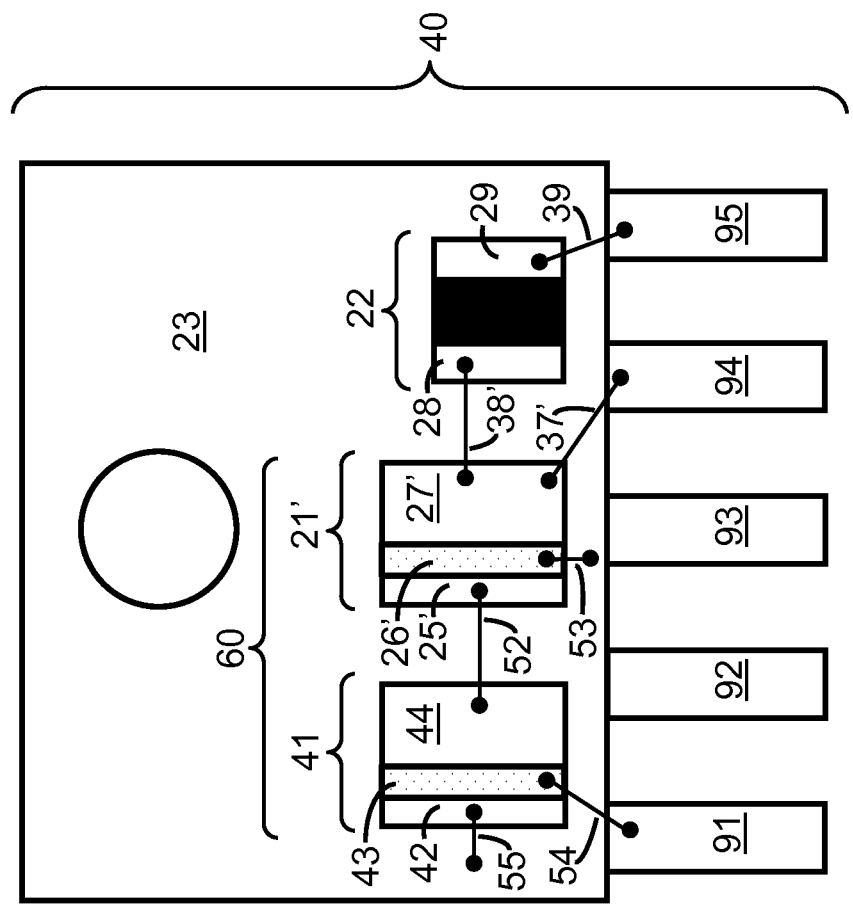

FIG. 10 shows a plan view of another single electronic component 40 that can be used in place of both the transistor 11 and the diode 12 in the boost converter circuit of FIG. 1. Using electronic component 40 in place of the transistor 11 and the diode 12 in a boost converter circuit, wherein transistor 11 and diode 12 are each individually packaged, can result in reduced or negligible EMI produced by the circuit even when the transistor is operated at higher switching speeds during circuit operation. The exposed plan view of FIG. 10 illustrates portions of the package along with the electronic devices which are encased in the package (not all of which is shown). The electronic component 40 includes a high-voltage III-N depletion-mode transistor 21', a low-voltage enhancement-mode transistor 41, and a III-N rectifying device 22 all encased in a single package. The package used for single electronic component 40 in FIG. 10 can be the same as that used for single electronic components 20 and 20' in FIGS. 5 and 9, respectively, i.e., the package for single electronic component 40 can be that of FIG. 4. The III-N rectifying device 22 can be a III-N diode, as in FIG. 5, or alternatively a second III-N transistor, as in FIG. 9, and has the same requirements and structure as the III-N rectifying device 22 in the single electronic component of FIG. 5 or 9.

The III-N D-mode transistor 21' is a high-voltage device, and is thereby at least capable of blocking the maximum voltage that would drop across transistor 11 in the conventional boost converter circuit of FIG. 1, which for high-voltage applications can be 300V, 600V, 1200V, or other suitable blocking voltage required by the application. In other words, III-N D-mode transistor 21' can block any voltage between 0V and at least $V_{max}$, where $V_{max}$ is the maximum voltage that would drop across the transistor 11. In some implementations, III-N D-mode transistor 21' can block any voltage between 0V and at least $2*V_{max}$. Typical III-N D-mode transistor threshold voltages $V_{th}$ for high-voltage devices are about −5 to −10V (D-mode=negative $V_{th}$). The E-mode transistor 41 can block any voltage between 0V and at least $|V_{th}|$, where $|V_{th}|$ is the magnitude (absolute value) of the threshold voltage of the III-N D-mode transistor 21'. In some implementations, the E-mode transistor 41 can block any voltage between 0V and at least about $2*|V_{th}|$. Hence, E-mode transistor 41 is a low-voltage device, as the voltages that it must be capable of blocking are substantially less than the circuit high voltage. In some implementations, the III-N D-mode transistor 21' can block any voltage between 0V and at least about 1200V and has a threshold voltage of about −5V, and the E-mode transistor 41 can block any voltage between 0V and at least about 5V, such as at least about 10V. In some implementations, III-N D-mode transistor 21' is a high-voltage III-N HEMT device, and E-mode transistor 41 is a Si MOS device or a III-N HEMT device. In other implementations, E-mode transistor 41 is a nitrogen-face III-N device, and III-N D-mode transistor 21' is a III-face III-N device.

When a III-N diode is used for III-N rectifying device 22 and a Si MOS device is used for E-mode transistor 41, the III-N D-mode transistor 21', E-mode transistor 41, and the III-N diode 22 are mounted inside the single package and connected as follows. Referring to FIG. 10, electrical connectors 37', 38', 39, and 52-55, which can be single or multiple wire bonds, are used to electrically connect portions of the package, III-N D-mode transistor 21', E-mode transistor 41, and III-N diode 22 to one another. The III-N D-mode transistor 21' and the III-N diode 22 are both mounted inside the package with their respective insulating or semi-insulating substrates or their respective conducting or semi-conducting substrates in contact with the package base 23, while the E-mode transistor 41 is mounted on an insulating spacer, and the side of the spacer opposite the E-mode transistor 41 contacts the package base 23. The insertion of an insulating spacer between the Si MOS device and the package base 23 may be required for a conventional Si MOS device, since a conventional Si MOS device tends to be a vertical device with its drain contact on an opposite side of the semiconductor body from its source electrode 42. The gate electrode 26' of the III-N D-mode transistor 21' and the e-mode transistor source electrode 42 (the source electrode of the Si MOS device) are both electrically connected to a conductive structural portion of the package, such as the package base 23, or can alternatively be electrically connected to source lead 93 of the package. Conductive connector 55 can be used to electrically connect e-mode transistor source electrode 42 to the package base 53 or to the source lead 93. The e-mode transistor gate electrode 43 (the gate electrode of the Si-MOS device) is electrically connected to the gate lead 91 of the package, such as by conductive connector 54. The e-mode transistor drain electrode 44 (the drain electrode of the Si MOS device) is electrically connected to the source contact 25' of the III-N D-mode transistor 21', such as by conductive connector 52. The drain electrode 27' of the III-N D-mode transistor 21' is electrically connected to the anode contact 28 of the III-N diode, such as by conductive connector 53. The drain electrode 27' and anode contact 28 are both electrically connected to drain lead 94 of the package, such as by wire bonding one or both of these contacts/electrodes to the drain lead 94. The cathode contact 29 of the III-N diode is electrically connected to cathode lead 95 of the package, such as by conductive connector 39.

When a low-voltage III-N enhancement-mode device is used for E-mode transistor 41, the electrical connections are the same as those shown in FIG. 10. However, a low-voltage III-N enhancement-mode device can include an insulating or semi-insulating portion, such as an insulating or semi-insulating substrate, in which case the III-N enhancement-mode device can be mounted directly to the package base 23 with its insulating or semi-insulating portion in contact with the package base or between the package base 23 and the device channel.

Assembly 60 in FIG. 10, which includes the high-voltage III-N D-mode transistor 21' and the low-voltage E-mode transistor 41 connected as shown, can operate similarly to or as a single high-voltage III-N E-mode transistor, i.e., a normally-off switch, with about the same threshold voltage as that of E-mode transistor 41 and a similar breakdown voltage to that of III-N D-mode transistor 21'. That is, an input voltage signal applied to the gate lead 91 relative to the package base 23 or source lead 93 can produce an output signal at the drain lead 94 that is the same as that produced when a single high-voltage III-N E-mode transistor replaces assembly 60 and is connected as shown in FIGS. 6 and 9. High-voltage III-N D-mode transistors and low-voltage E-mode transistors may both be fabricated more readily and manufactured more reproducibly than high-voltage III-N E-mode devices, so the electronic component 40 of FIG. 10 may be easier to manufacture than the electronic components 20 and 20' of FIGS. 6 and 9, respectively.

Figure 11:
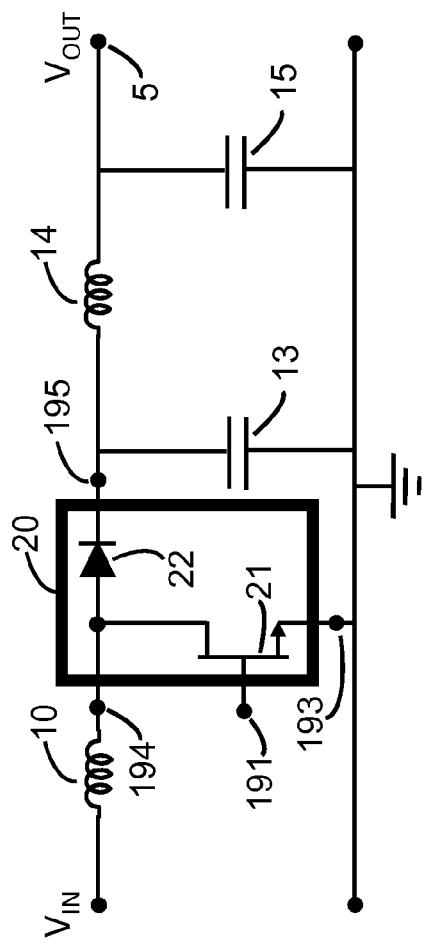
FIGS. 11 and 12 are circuit schematics of voltage converter circuits.
Figure 12:
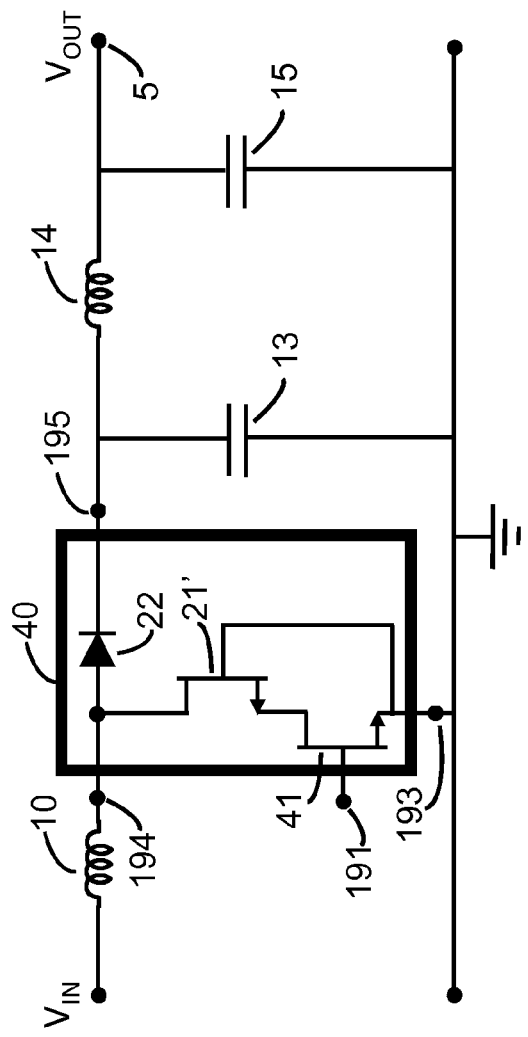

A circuit schematic of a boost converter circuit utilizing the electronic component 20 of FIG. 5 is shown in FIG. 11, while FIG. 12 shows a circuit schematic of a boost converter circuit utilizing the electronic component 40 of FIG. 10. In FIGS. 11 and 12, node 191 is electrically connected to package lead 91 of electronic component 20 or 40, node 194 is electrically connected to package lead 94 of electronic component 20 or 40, node 195 is electrically connected to package lead 95 of electronic component 20 or 40, and node 193 is electrically connected to either package lead 93 or to the package base 23 of electronic component 20 or 40.

Figure 13:
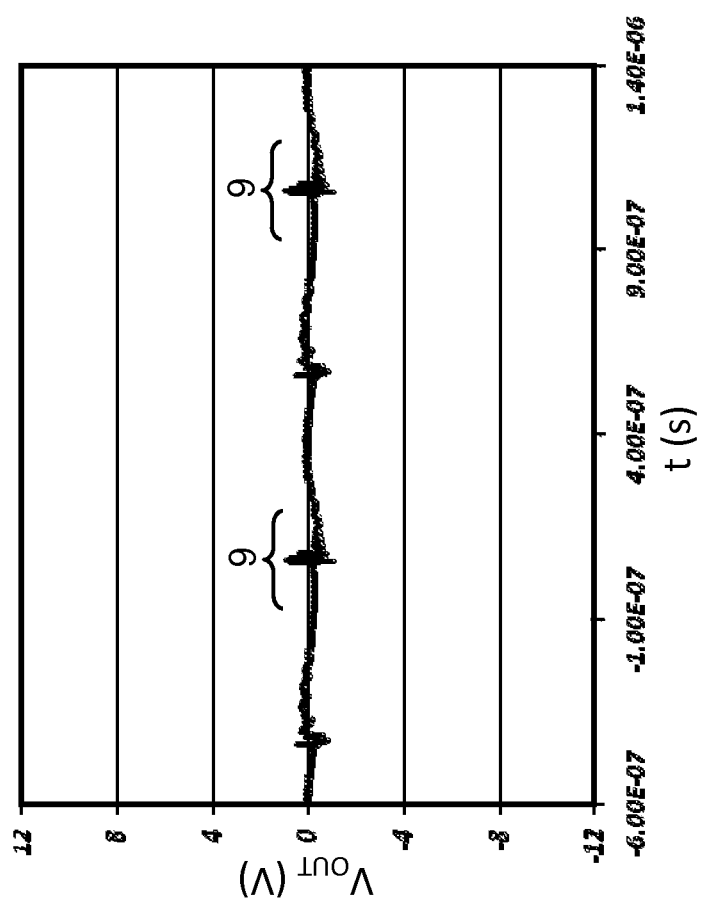
FIG. 13 is a plot of transient voltage noise versus time at the output node of the voltage converter circuit of FIG. 12.

FIG. 13 shows a plot of the output voltage noise versus time as measured by the applicant at the output node 5 of the boost converter circuit of FIG. 12 during circuit operation. For this measurement, a high-voltage III-N D-mode heterojunction field effect transistor (HFET) was used for III-N D-mode transistor 21', a low-voltage Si MOS E-mode device was used for E-mode transistor 41, a III-N diode was used for diode 22, and the circuit operating conditions were the same as those for FIG. 3. The transistor was switched at a switching speed of 200 Volts/nanosecond. As can be seen, the ringing 9 measured at the output node 5 was substantially smaller than the ringing at the output node measured in FIG. 3. The peak output voltage noise was less than 1 V, which is over 10 times less than the peak output voltage noise measured in FIG. 3. EMI could be reduced even further, and/or even higher switching speeds could be used without generating higher levels of EMI if electronic component 20 or 20' from FIGS. 5 and 9, respectively, were used in place of electronic component 40, as in the circuit of FIG. 11.

The reduction in EMI observed for the circuit of FIG. 12, as compared to that illustrated in FIG. 3 for a boost-converter circuit which included a smaller number of discrete devices but in which the transistor and diode were individually packaged, may be attributed to reductions in parasitic resistances, capacitances, and/or inductances, these reductions being enabled by the use of a single package encasing all of the diodes and transistors. In the circuit of FIG. 1, in which the transistor 11 and diode 12 are individually packaged, the area of the circuit footprint as well as the length of the electrical connections is limited by the individual packages and may be too large, thus resulting in intolerably high parasitics and substantial EMI generation, even when III-N devices are used for transistor 11 and diode 12. The use of a single package encasing or encapsulating the rectifying device and transistors in the circuit of FIG. 12 can allow for a smaller circuit footprint as well as shorter electrical connectors, i.e., wire bonds, between electrodes and components, thereby reducing parasitic resistances, capacitances, and/or inductances. Hence, the electronic components 20, 20', and 40 of FIGS. 6, 9, and 10, respectively, should be configured such that parasitic resistances, capacitances, and inductances are minimized, i.e., they should be configured such that the area of the footprint as well as the lengths of the electrical connectors are minimized. For electronic component 40 of FIG. 10, when a Si MOS device is used for E-mode transistor 41, it is also preferable for the Si MOS device to have as small a drain area (as measured parallel to a main surface of the package base 23) as possible, since the large drain-to-ground capacitance, resulting from the drain being separated from the package base 23 only by an insulating spacer, can further contribute to EMI in the circuit. Furthermore, since the electronic components 20 and 20' of FIGS. 6 and 9, respectively, include a smaller number of discrete devices than electronic component 40 in FIG. 10, and all of the diodes and transistors in electronic components 20 and 20' can be mounted to the package base 23 without requiring an insulating shim, EMI produced by a circuit using electronic component 20 or 20' could be even smaller than that produced by the same circuit in which electronic component 20 or 20' is replaced by electronic component 40, and/or higher switching speeds could be used without generating higher levels of EMI.

Figure 15:
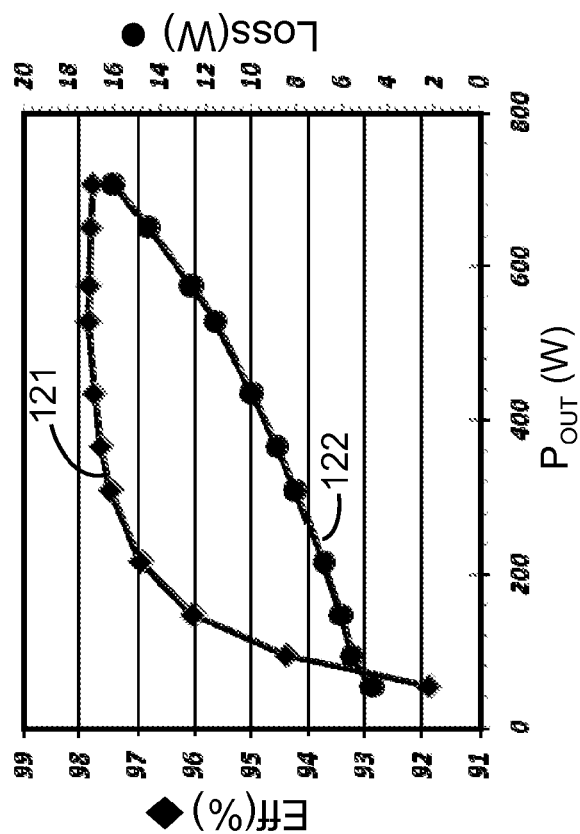
FIGS. 14 and 15 are plots of efficiency and power loss versus output power for the boost converter circuit of FIG. 12.
Figure 14:
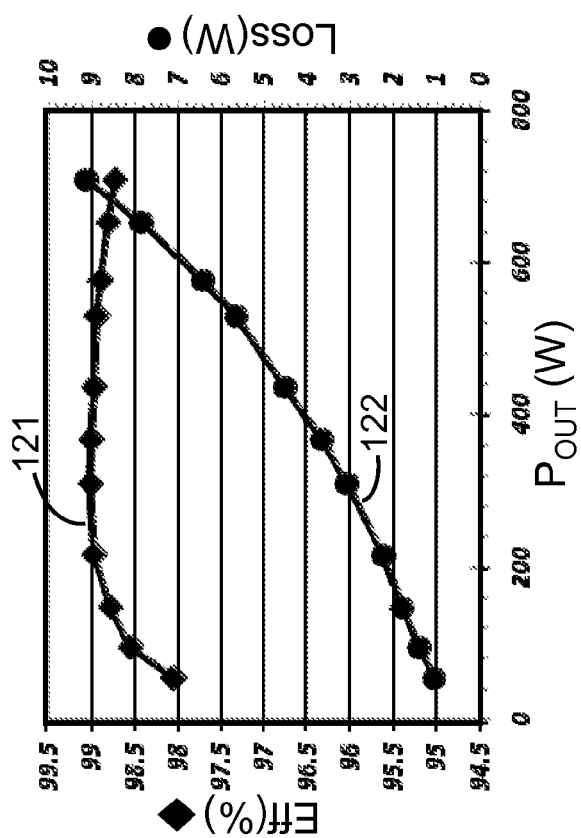

FIGS. 14 and 15 show plots of the efficiency 121 and power loss 122 versus output power for the boost converter of FIG. 12, which includes electronic component 40 of FIG. 10. Electronic component 40 included a high-voltage III-N depletion-mode HEMT, a low-voltage enhancement-mode Si MOS transistor, and a III-N diode. For the measurements of both FIGS. 14 and 15, voltage was converted from 200V to 400V, i.e., the conversion ratio was 1:2. For the measurement of FIG. 14, the circuit was operated at a frequency of 100 kHz, while for the measurement of FIG. 15, the circuit was operated at a frequency of 1 MHz. As seen in FIG. 14, at 100 k Hz the boost converter exhibits an efficiency greater than 97.8% at all output powers between about 50 W and 700 W, with a peak efficiency greater than about 99%. As seen in FIG. 15, at 1 MHz the boost converter exhibits an efficiency greater than 91.8% at all output powers between about 50 W and 700 W, with a peak efficiency greater than about 97.8%.

A number of implementations have been described. Nevertheless, it will be understood that various modifications may be made without departing from the spirit and scope of the techniques and devices described herein. Accordingly, other implementations are within the scope of the following claims.

What is claimed is:

1. An electronic component, comprising:
a pair of transistors, wherein a first transistor of the pair of transistors is a III-N transistor;
a III-N rectifying device; and
a single package enclosing the pair of transistors and the III-N rectifying device, wherein
a gate electrode of the III-N transistor is electrically connected to a first lead of the single package or to a conductive structural portion of the single package,
a drain electrode of the III-N transistor is electrically connected to a second lead of the single package and to a first electrode of the III-N rectifying device, and
a second electrode of the III-N rectifying device is electrically connected to a third lead of the single package.

2. The electronic component of claim 1, wherein the III-N transistor is a field-effect transistor.

3. The electronic component of claim 1, wherein the III-N transistor is a high voltage switching transistor.

4. The electronic component of claim 1, wherein a second transistor of the pair of transistors is an enhancement-mode device.

5. The electronic component of claim 1, wherein the III-N rectifying device is a III-N diode, the first electrode is an anode electrode, and the second electrode is a cathode electrode.

6. The electronic component of claim 5, wherein the III-N transistor is a lateral device comprising an insulating or semi-insulating portion, and the insulating or semi-insulating portion is mounted directly to the conductive structural portion of the single package, without an insulating spacer between the III-N transistor and the conductive structural portion of the single package.

7. The electronic component of claim 6, wherein the insulating or semi-insulating portion is an insulating or semi-insulating substrate.

8. The electronic component of claim 5, wherein the III-N transistor is a lateral device comprising a conducting or semi-conducting substrate, and an insulating or semi-insulating III-N layer is between the conducting or semi-conducting substrate and a channel of the III-N transistor, wherein the conducting or semi-conducting substrate is mounted directly to the conductive structural portion of the single package, without an insulating spacer between the III-N transistor and the conductive structural portion of the single package.

9. The electronic component of claim 8, wherein the conducting or semi-conducting substrate is a semi-conducting silicon substrate.

10. The electronic component of claim 5, wherein the III-N transistor and the III-N diode are on a common substrate.

11. The electronic component of claim 5, wherein the III-N diode is a lateral device comprising a conducting or semi-conducting substrate, and an insulating or semi-insulating III-N layer is between the conducting or semi-conducting substrate and a channel of the III-N diode, wherein the conducting or semi-conducting substrate is mounted directly to the conductive structural portion of the single package, without an insulating spacer between the III-N diode and the conductive structural portion of the single package.

12. The electronic component of claim 11, wherein the conducting or semi-conducting substrate is a semi-conducting silicon substrate.

13. The electronic component of claim 5, wherein the III-N diode is a lateral device comprising an insulating or semi-insulating portion, and the insulating or semi-insulating portion is mounted directly to the conductive structural portion of the single package, without an insulating spacer between the III-N diode and the conductive structural portion of the single package.

14. The electronic component of claim 13, wherein the insulating or semi-insulating portion is an insulating or semi-insulating substrate.

15. The electronic component of claim 1, wherein the III-N transistor is a first III-N transistor and the III-N rectifying device is a second III-N transistor.

16. The electronic component of claim 15, wherein the first III-N transistor or the second III-N transistor is a lateral device comprising an insulating or semi-insulating portion, and the insulating or semi-insulating portion is mounted directly to the conductive structural portion of the single package without an insulating spacer between the first III-N transistor and the conductive structural portion of the single package or between the second III-N transistor and the conductive structural portion of the single package.

17. The electronic component of claim 16, wherein the insulating or semi-insulating portion is an insulating or semi-insulating substrate.

18. The electronic component of claim 15, wherein the first III-N transistor or the second III-N transistor is a lateral device comprising a conducting or semi-conducting substrate, and an insulating or semi-insulating III-N layer between the conducting or semi-conducting substrate and a channel of the first III-N transistor or the second III-N transistor, wherein the conducting or semi-conducting substrate is mounted directly to the conductive structural portion of the single package, without an insulating spacer between the first III-N transistor and the conductive structural portion of the single package or between the second III-N transistor and the conductive structural portion of the single package.

19. The electronic component of claim 18, wherein the conducting or semi-conducting substrate is a semi-conducting silicon substrate.

20. The electronic component of claim 15, wherein the first III-N transistor and the second III-N transistor are formed on a common substrate.

21. The electronic component of claim 1, wherein a source electrode of a second transistor of the pair of transistors is electrically connected to the conductive structural portion of the single package or to a source lead of the single package.

22. The electronic component of claim 1, wherein the III-N transistor is a III-N depletion-mode transistor, and a second transistor of the pair of transistors is an enhancement-mode transistor, the enhancement-mode transistor comprising an e-mode transistor source electrode, an e-mode transistor gate electrode, and an e-mode transistor drain electrode, wherein the e-mode transistor source electrode is electrically connected to the conductive structural portion of the single package or to a source lead of the single package, the e-mode transistor drain electrode is electrically connected to a source electrode of the III-N depletion-mode transistor, and the e-mode transistor gate electrode is electrically connected to the first lead of the single package.

23. The electronic component of claim 22, wherein the III-N depletion-mode transistor is a high-voltage switching transistor, and the enhancement-mode transistor is a low-voltage transistor.

24. The electronic component of claim 23, wherein the enhancement-mode transistor is a Si MOS device.

25. The electronic component of claim 1, wherein the electronic component is a part of a voltage converter.

26. An electronic component, comprising:
a III-N depletion-mode transistor;
an enhancement-mode transistor;
a III-N rectifying device; and
a single package enclosing each of the III-N depletion-mode transistor, the enhancement-mode transistor, and the III-N rectifying device, wherein
a gate electrode of the III-N depletion-mode transistor is electrically connected to a source electrode of the enhancement-mode transistor, a source electrode of the III-N depletion-mode transistor is electrically connected to a drain electrode of the enhancement-mode transistor, a drain electrode of the III-N depletion-mode transistor is electrically connected to a second lead of the single package and to a first electrode of the III-N rectifying device, and a second electrode of the III-N rectifying device is electrically connected to a first lead of the single package.

27. The electronic component of claim 26, wherein the enhancement-mode transistor is a Si MOS device.

28. The electronic component of claim 26, wherein the III-N rectifying device is a III-N diode, the first electrode is an anode electrode, and the second electrode is a cathode electrode.

29. The electronic component of claim 26, wherein the electronic component is a part of a voltage converter.

30. The electronic component of claim 26, wherein the III-N depletion-mode transistor and the III-N rectifying device are on a common substrate.

31. An electronic component, comprising:
a III-N depletion-mode transistor;
an enhancement-mode transistor;
a III-N rectifying device; and
a single package enclosing each of the III-N depletion-mode transistor, the enhancement-mode transistor, and the III-N rectifying device, the single package comprising a first lead and a second lead; wherein
a gate electrode of the III-N depletion-mode transistor is electrically connected to the first lead of the single package or to a conductive structural portion of the single package, a source electrode of the III-N depletion-mode transistor is electrically connected to a drain electrode of the enhancement-mode transistor, a drain electrode of the III-N depletion-mode transistor is electrically connected to a first electrode of the III-N rectifying device, and a second electrode of the III-N rectifying device is electrically connected to the second lead of the single package.

32. The electronic component of claim 31, wherein the drain electrode of the III-N depletion-mode transistor is also electrically connected to a third lead of the single package.

33. The electronic component of claim 31, wherein the III-N rectifying device comprises a diode, and the first electrode of the III-N rectifying device comprises an anode.

34. The electronic component of claim 31, wherein the electronic component is a part of a voltage converter.

35. The electronic component of claim 31, wherein the III-N depletion-mode transistor and the III-N rectifying device are on a common substrate.

36. The electronic component of claim 31, wherein the drain electrode of the III-N depletion-mode transistor is electrically connected to the second lead of the single package.

* * * * *

UNITED STATES PATENT AND TRADEMARK OFFICE
CERTIFICATE OF CORRECTION

| | | |
|---|---|---|
| PATENT NO. | : 8,816,497 B2 | Page 1 of 1 |
| APPLICATION NO. | : 12/684838 | |
| DATED | : August 26, 2014 | |
| INVENTOR(S) | : Yifeng Wu | |

It is certified that error appears in the above-identified patent and that said Letters Patent is hereby corrected as shown below:

Title Page, item (56),

Page 2, Column 2, OTHER PUBLICATIONS, at line 2: delete "Drivided" and insert --Divided--;

Page 2, Column 2, OTHER PUBLICATIONS, at line 37: delete "HEMPTs" and insert --HEMTs--; and Page 3, Column 2, OTHER PUBLICATIONS, at line 13: delete "officerBon" and insert --officer Bon--.

Signed and Sealed this
Twenty-third Day of December, 2014

Michelle K. Lee
*Deputy Director of the United States Patent and Trademark Office*